United States Patent
Saigusa et al.

(10) Patent No.: US 7,566,368 B2
(45) Date of Patent: *Jul. 28, 2009

(54) METHOD AND APPARATUS FOR AN IMPROVED UPPER ELECTRODE PLATE IN A PLASMA PROCESSING SYSTEM

(75) Inventors: Hidehito Saigusa, Nirasaki (JP); Taira Takase, Nirasaki (JP); Kouji Mitsuhashi, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 3 days.

This patent is subject to a terminal disclaimer.

(21) Appl. No.: 11/567,023

(22) Filed: Dec. 5, 2006

(65) Prior Publication Data
US 2007/0096658 A1    May 3, 2007

Related U.S. Application Data

(63) Continuation of application No. 10/259,757, filed on Sep. 30, 2002, now Pat. No. 7,166,200.

(51) Int. Cl.
*C23C 16/00* (2006.01)
*C23C 14/00* (2006.01)
*B05C 11/00* (2006.01)
*C23F 1/00* (2006.01)
*H01L 21/306* (2006.01)
*H01J 7/24* (2006.01)
*H05B 31/26* (2006.01)

(52) U.S. Cl. .............. 118/715; 118/663; 118/664; 118/665; 118/666; 118/712; 118/713; 118/723 R; 156/345.24; 156/345.25; 156/345.5; 204/298.01; 315/111.21

(58) Field of Classification Search .......... 118/663, 118/664, 665, 666, 712, 713, 715, 723 R, 118/723; 156/345.24, 345.25, 345.5
See application file for complete search history.

(56) References Cited

U.S. PATENT DOCUMENTS

| 4,310,390 A | 1/1982 | Bradley et al. |
| 4,357,387 A | 11/1982 | George et al. .............. 442/71 |
| 4,469,619 A | 9/1984 | Ohno et al. |
| 4,593,007 A | 6/1986 | Novinski |

(Continued)

FOREIGN PATENT DOCUMENTS

DE    94 21 671    7/1996

(Continued)

OTHER PUBLICATIONS

English abstract of JP 59-186325, assignee Canon, Oct. 1984.*

(Continued)

*Primary Examiner*—Michael Cleveland
*Assistant Examiner*—Keath T Chen
(74) *Attorney, Agent, or Firm*—Oblon, Spivak, McClelland, Maier & Neustadt, P.C.

(57) ABSTRACT

The present invention presents an improved upper electrode for a plasma processing system, wherein the design and fabrication of an electrode plate coupled to an upper assembly advantageously provides gas injection of a process gas with substantially minimal erosion of the electrode plate.

75 Claims, 9 Drawing Sheets

U.S. PATENT DOCUMENTS

| | | | |
|---|---|---|---|
| 4,612,077 A | 9/1986 | Tracy et al. | |
| 4,649,858 A | 3/1987 | Sakai et al. | |
| 4,842,683 A | 6/1989 | Cheng et al. | |
| 4,877,757 A | 10/1989 | York et al. | |
| 5,000,113 A | 3/1991 | Wang et al. | |
| 5,074,456 A | 12/1991 | Degner et al. | |
| 5,126,102 A | 6/1992 | Takahashi et al. | |
| 5,180,467 A * | 1/1993 | Cook et al. | 156/345.34 |
| 5,334,462 A | 8/1994 | Vine et al. | |
| 5,362,335 A | 11/1994 | Rungta | |
| 5,366,585 A | 11/1994 | Robertson et al. | |
| 5,367,838 A | 11/1994 | Visaisouk et al. | |
| 5,423,936 A | 6/1995 | Tomita et al. | |
| 5,426,310 A | 6/1995 | Tamada et al. | |
| 5,484,752 A | 1/1996 | Waku et al. | |
| 5,489,449 A | 2/1996 | Umeya et al. | |
| 5,494,713 A | 2/1996 | Ootuki | |
| 5,521,790 A | 5/1996 | Ruckel et al. | 361/234 |
| 5,534,356 A | 7/1996 | Mahulikar et al. | |
| 5,551,190 A | 9/1996 | Yamagishi et al. | |
| 5,556,501 A | 9/1996 | Collins et al. | |
| 5,614,055 A | 3/1997 | Fairbairn et al. | |
| 5,637,237 A | 6/1997 | Oehrlein et al. | |
| 5,641,375 A | 6/1997 | Nitescu et al. | |
| 5,651,723 A | 7/1997 | Bjornard et al. | |
| 5,680,013 A | 10/1997 | Dornfest et al. | |
| 5,725,960 A | 3/1998 | Konishi et al. | |
| 5,759,360 A | 6/1998 | Ngan et al. | |
| 5,798,016 A | 8/1998 | Oehrlein et al. | |
| 5,820,723 A * | 10/1998 | Benjamin et al. | 156/345.51 |
| 5,834,070 A | 11/1998 | Movchan et al. | |
| 5,851,343 A | 12/1998 | Hsu et al. | |
| 5,868,848 A | 2/1999 | Tsukamoto | |
| 5,879,575 A | 3/1999 | Tepman et al. | |
| 5,882,411 A * | 3/1999 | Zhao et al. | 118/715 |
| 5,885,356 A | 3/1999 | Zhao et al. | |
| 5,885,402 A | 3/1999 | Esquibel | 156/345.24 |
| 5,891,253 A | 4/1999 | Wong et al. | |
| 5,891,350 A | 4/1999 | Shan et al. | |
| 5,892,278 A | 4/1999 | Horita et al. | 257/706 |
| 5,894,887 A | 4/1999 | Kelsey et al. | |
| 5,895,586 A | 4/1999 | Kaji et al. | |
| 5,900,064 A | 5/1999 | Kholodenko | |
| 5,902,763 A | 5/1999 | Waku et al. | |
| 5,904,778 A | 5/1999 | Lu et al. | |
| 5,911,852 A | 6/1999 | Katayama et al. | |
| 5,919,332 A | 7/1999 | Koshiishi et al. | |
| 5,925,228 A | 7/1999 | Panitz et al. | 204/484 |
| 5,944,902 A | 8/1999 | Redeker et al. | |
| 5,948,521 A | 9/1999 | Dlugosch et al. | |
| 5,952,054 A | 9/1999 | Sato et al. | |
| 5,952,060 A | 9/1999 | Ravi | |
| 5,955,182 A | 9/1999 | Yasuda et al. | |
| 5,968,377 A | 10/1999 | Yuasa et al. | |
| 5,985,102 A | 11/1999 | Leiphart | |
| 5,994,662 A | 11/1999 | Murugesh | |
| 6,068,729 A | 5/2000 | Shrotriya | 156/345.26 |
| 6,073,449 A | 6/2000 | Watanabe et al. | 62/3.2 |
| 6,079,356 A * | 6/2000 | Umotoy et al. | 118/723 E |
| 6,096,161 A | 8/2000 | Kim et al. | |
| 6,106,625 A | 8/2000 | Koai et al. | |
| 6,108,189 A | 8/2000 | Weldon et al. | |
| 6,110,287 A | 8/2000 | Arai et al. | |
| 6,120,640 A | 9/2000 | Shih et al. | |
| 6,120,955 A | 9/2000 | Tokutake et al. | |
| 6,123,791 A | 9/2000 | Han et al. | |
| 6,123,804 A | 9/2000 | Babassi et al. | |
| 6,129,808 A | 10/2000 | Wicker et al. | |
| 6,139,983 A | 10/2000 | Ohashi et al. | |
| 6,143,646 A | 11/2000 | Wetzel | |
| 6,170,429 B1 | 1/2001 | Schoepp et al. | |
| 6,176,969 B1 | 1/2001 | Park et al. | |
| 6,182,603 B1 | 2/2001 | Shang et al. | |
| 6,210,486 B1 | 4/2001 | Mizukami et al. | |
| 6,221,202 B1 | 4/2001 | Walko, II | |
| 6,246,479 B1 | 6/2001 | Jung et al. | |
| 6,264,788 B1 | 7/2001 | Tomoyasu et al. | |
| 6,265,757 B1 | 7/2001 | Brady | |
| 6,266,133 B1 | 7/2001 | Miyajima et al. | |
| 6,296,716 B1 | 10/2001 | Haerle et al. | |
| 6,296,740 B1 | 10/2001 | Xie et al. | |
| 6,335,293 B1 | 1/2002 | Luo et al. | |
| 6,364,949 B1 | 4/2002 | Or et al. | |
| 6,368,987 B1 | 4/2002 | Kopacz et al. | |
| 6,373,573 B1 | 4/2002 | Jung et al. | |
| 6,383,333 B1 | 5/2002 | Haino et al. | |
| 6,383,964 B1 | 5/2002 | Nakahara et al. | |
| 6,387,817 B1 | 5/2002 | Buckfeller | |
| 6,394,026 B1 | 5/2002 | Wicker et al. | |
| 6,413,578 B1 | 7/2002 | Stowell et al. | |
| 6,444,083 B1 | 9/2002 | Steger et al. | |
| 6,514,377 B1 | 2/2003 | Morimoto | |
| 6,519,037 B2 | 2/2003 | Jung et al. | |
| 6,527,911 B1 | 3/2003 | Yen et al. | |
| 6,533,910 B2 | 3/2003 | O'Donnell et al. | |
| 6,537,429 B2 | 3/2003 | O'Donnell et al. | |
| 6,544,380 B2 | 4/2003 | Tomoyasu et al. | |
| 6,554,906 B1 | 4/2003 | Kuibira et al. | |
| 6,562,186 B1 | 5/2003 | Saito et al. | 156/345.24 |
| 6,570,654 B2 | 5/2003 | Jung et al. | |
| 6,583,064 B2 | 6/2003 | Wicker et al. | |
| 6,590,660 B2 | 7/2003 | Jung et al. | |
| 6,613,204 B2 | 9/2003 | Xie et al. | |
| 6,613,442 B2 | 9/2003 | O'Donnell et al. | |
| 6,632,549 B1 | 10/2003 | Ohashi et al. | |
| 6,641,697 B2 | 11/2003 | Han et al. | |
| 6,663,714 B2 | 12/2003 | Mizuno et al. | |
| 6,695,929 B2 | 2/2004 | Kanekiyo et al. | |
| 6,726,801 B2 | 4/2004 | Ahn | |
| 6,733,620 B1 | 5/2004 | Sugiyama et al. | |
| 6,738,862 B1 | 5/2004 | Ross et al. | |
| 6,771,483 B2 | 8/2004 | Harada et al. | |
| 6,776,873 B1 | 8/2004 | Sun et al. | |
| 6,783,863 B2 | 8/2004 | Harada et al. | |
| 6,783,875 B2 | 8/2004 | Yamada et al. | |
| 6,798,519 B2 | 9/2004 | Nishimoto et al. | |
| 6,805,952 B2 | 10/2004 | Chang et al. | |
| 6,806,949 B2 | 10/2004 | Ludviksson et al. | |
| 6,811,651 B2 | 11/2004 | Long | |
| 6,830,622 B2 | 12/2004 | O'Donnell et al. | |
| 6,833,279 B2 | 12/2004 | Choi | |
| 6,837,966 B2 | 1/2005 | Nishimoto et al. | |
| 6,852,433 B2 | 2/2005 | Maeda | |
| 6,863,594 B2 | 3/2005 | Preising | |
| 7,364,798 B2 | 3/2005 | Harada et al. | |
| 6,875,477 B2 | 4/2005 | Trickett et al. | |
| 6,884,516 B2 | 4/2005 | Harada et al. | |
| 6,894,769 B2 | 5/2005 | Ludviksson et al. | |
| 6,896,785 B2 | 5/2005 | Shatrov et al. | |
| 7,147,749 B2 | 12/2006 | Nishimoto et al. | |
| 7,163,585 B2 | 1/2007 | Nishimoto et al. | |
| 7,300,537 B2 | 11/2007 | O'Donnell et al. | |
| 7,311,797 B2 | 12/2007 | O'Donnell et al. | |
| 2001/0003271 A1 | 6/2001 | Otsuki | |
| 2001/0050144 A1 | 12/2001 | Nishikawa et al. | |
| 2002/0018902 A1* | 2/2002 | Tsukatani et al. | 428/469 |
| 2002/0076508 A1 | 6/2002 | Chiang et al. | |
| 2002/0086118 A1 | 7/2002 | Chang et al. | |
| 2002/0086501 A1 | 7/2002 | O'Donnell et al. | |
| 2002/0086545 A1 | 7/2002 | O'Donnell et al. | |
| 2002/0086553 A1 | 7/2002 | O'Donnell et al. | |
| 2002/0090464 A1 | 7/2002 | Mingwei et al. | |
| 2002/0142611 A1 | 10/2002 | O'Donnell et al. | |
| 2002/0177001 A1 | 11/2002 | Harada et al. | 428/469 |

| | | | | | | |
|---|---|---|---|---|---|---|
| 2003/0010446 A1 | 1/2003 | Kajiyama et al. | | JP | 06-287739 | 10/1994 |
| 2003/0029563 A1 | 2/2003 | Kaushal et al. | | JP | 07-058013 A | 3/1995 |
| 2003/0084848 A1 | 5/2003 | Long | | JP | 07-126827 | 5/1995 |
| 2003/0113479 A1 | 6/2003 | Fakuda et al. ............... 427/569 | | JP | 07-176524 | 7/1995 |
| 2003/0150419 A1 | 8/2003 | Daragheh et al. | | JP | 07-226378 | 8/1995 |
| 2003/0200929 A1 | 10/2003 | Otsuki | | JP | 07-245295 | 9/1995 |
| 2004/0026372 A1 | 2/2004 | Takenaka et al. | | JP | 08-037180 | 2/1996 |
| 2004/0035364 A1 | 2/2004 | Tomoyoshi et al. | | JP | 08-041309 | 2/1996 |
| 2004/0050495 A1 | 3/2004 | Sumiya et al. | | JP | 08-081777 | 3/1996 |
| 2004/0060516 A1 | 4/2004 | Nishimoto et al. | | JP | 08-268751 | 10/1996 |
| 2004/0060656 A1 | 4/2004 | Saigusa et al. | | JP | 08-339895 | 12/1996 |
| 2004/0060657 A1 | 4/2004 | Saigusa et al. | | JP | 09-069554 | 3/1997 |
| 2004/0060658 A1 | 4/2004 | Nishimoto et al. | | JP | 09-228070 | 9/1997 |
| 2004/0060661 A1 | 4/2004 | Nishmoto et al. | | JP | 09-272987 | 10/1997 |
| 2004/0060779 A1 | 4/2004 | Kreger | | JP | 10-004083 | 1/1998 |
| 2004/0061447 A1 | 4/2004 | Saigusa et al. | | JP | 10-045461 | 2/1998 |
| 2004/0063333 A1 | 4/2004 | Saigusa et al. | | JP | 10-045467 | 2/1998 |
| 2004/0072426 A1 | 4/2004 | Jung | | JP | 10-130884 | 5/1998 |
| 2004/0081746 A1 | 4/2004 | Imafuku | | JP | 10-226869 | 8/1998 |
| 2004/0083970 A1 | 5/2004 | Imafuku et al. | | JP | 10-214819 | 9/1998 |
| 2004/0125359 A1 | 7/2004 | Ludviksson et al. | | JP | 10-251871 | 9/1998 |
| 2004/0168640 A1 | 9/2004 | Muto et al. | | JP | 11-001757 | 1/1999 |
| 2004/0173155 A1 | 9/2004 | Nishimoto et al. | | JP | 11-080925 | 3/1999 |
| 2004/0216667 A1 | 11/2004 | Mitsuhashi et al. | | JP | 11-207161 | 8/1999 |
| 2005/0103268 A1 | 5/2005 | Nishimoto et al. | | JP | 11-233292 | 8/1999 |
| 2005/0103275 A1 | 5/2005 | Sasaki et al. | | JP | 11-310451 | 11/1999 |
| 2005/0150866 A1 | 7/2005 | O'Donnell ................... 216/67 | | JP | 11-312646 | 11/1999 |
| 2006/0134919 A1 | 6/2006 | Hamelin et al. | | JP | 2000-119840 A | 4/2000 |
| 2007/0028839 A1 | 2/2007 | Saigusa et al. | | JP | 2000-124197 | 4/2000 |
| 2007/0034337 A1 | 2/2007 | Nishimoto et al. | | JP | 2000-303180 | 10/2000 |
| 2007/0096658 A1 | 5/2007 | Saigusa et al. | | JP | 2001-031484 | 2/2001 |
| 2007/0102287 A1 | 5/2007 | Nishimoto et al. | | JP | 2001-152307 | 6/2001 |
| 2007/0107846 A1 | 5/2007 | Saigusa et al. | | JP | 2001-164354 | 6/2001 |
| 2007/0125494 A1 | 6/2007 | Saigusa et al. | | JP | 2001-226773 | 8/2001 |
| 2007/0204794 A1 | 9/2007 | Nishimoto et al. | | JP | 2002-151473 | 5/2002 |
| 2008/0069966 A1 | 3/2008 | Otsuki | | KR | 1991-002451 | 6/1988 |
| 2008/0070032 A1 | 3/2008 | Otsuki | | KR | 1999-0008937 | 9/1994 |
| 2008/0070051 A1 | 3/2008 | Harada et al. | | KR | 1998-063542 | 10/1998 |
| | | | | KR | 1999-008142 | 1/1999 |
| | | | | KR | 1999-13565 | 2/1999 |
| | | | | KR | 2002-0027373 | 4/2002 |
| | | | | KR | 10/2004-0007601 | 1/2004 |

FOREIGN PATENT DOCUMENTS

| | | |
|---|---|---|
| EP | 0326318 | 8/1989 |
| EP | 0 508 731 | 10/1992 |
| EP | 0 573 057 | 12/1993 |
| EP | 0 814 495 | 6/1997 |
| EP | 0 799 904 | 10/1997 |
| EP | 0 841 838 | 5/1998 |
| EP | 1 069 603 | 1/2001 |
| EP | 1 081 749 | 7/2001 |
| EP | 1 156 130 | 11/2001 |
| GB | 2 252 567 | 8/1992 |
| JP | 59-186325 * | 10/1984 |
| JP | 61-207566 | 9/1986 |
| JP | 62-067161 | 3/1987 |
| JP | 63-000450 | 1/1988 |
| JP | 64-039728 | 2/1989 |
| JP | 1-120328 | 8/1989 |
| JP | 1-312087 | 12/1989 |
| JP | 02-267967 | 11/1990 |
| JP | 03-115535 | 5/1991 |
| JP | 4-238882 | 8/1992 |
| JP | 05-070922 | 3/1993 |
| JP | 05-117064 | 5/1993 |
| JP | 05-121360 | 5/1993 |
| JP | 05-198532 | 8/1993 |
| JP | 05-238855 | 9/1993 |
| JP | 05-238859 | 9/1993 |
| JP | 06-011346 | 2/1994 |
| JP | 06-057396 | 3/1994 |
| JP | 06-136505 | 5/1994 |
| JP | 06-142822 | 5/1994 |
| JP | 06-196548 | 7/1994 |
| JP | 06-256926 | 9/1994 |

| | | |
|---|---|---|
| WO | 99/50886 | 10/1999 |
| WO | 01/42526 | 6/2001 |
| WO | 02/39495 | 5/2002 |
| WO | 02/48421 | 6/2002 |
| WO | 2004/030011 | 4/2004 |
| WO | 2004/030012 | 4/2004 |
| WO | 2004/030013 | 4/2004 |
| WO | 2004/030014 | 4/2004 |
| WO | 2004/030015 | 4/2004 |
| WO | 2004/030020 | 4/2004 |
| WO | 2004/030426 | 4/2004 |
| WO | 2004/095530 | 11/2004 |
| WO | 2004/095532 | 11/2004 |

OTHER PUBLICATIONS

Production drawing for Deposition Shield, Upper believed to be sold in the U.S. on Apr. 12, 2000.
Production drawing for Deposition Shield believed to be sold in the U.S. prior to Sep. 30, 2001.
Production drawing for Upper Electrode believed to be sold in the U.S. prior to Sep. 30, 2001.
JIS Using Series, "Spraying Techniques Manual.", p. 95 (Oct. 30, 1998, Japanese Standard Association), with English Translation.
Kim, Hee Jee, "Plasma-Sprayed Alumina-Yttria Ceramic Coatings for Cavitation-Erosion Protection," Sep. 1989, pp. 139-146.
Yousha Gitjutsu Handbook, 1$^{st}$ Edition, Japan Thermal Spraying Society, Techno Consultants, Inc., pp. 316-317 (1998) (with partial English translation).

* cited by examiner

METHOD AND APPARATUS FOR AN IMPROVED UPPER ELECTRODE PLATE IN A PLASMA PROCESSING SYSTEM

CROSS-REFERENCE TO RELATED APPLICATIONS

This application is a continuation of and claims the benefit of priority under 35 USC § 120 from U.S. Ser. No. 10/259,757, filed Sep. 30, 2002, now U.S. Pat. No. 7,166,200. This application is also related to U.S. Pat. No. 7,147,749, entitled "Method and apparatus for an improved upper electrode plate with deposition shield in a plasma processing system", filed on Sep. 30, 2002; U.S. Pat. No. 6,837,966, entitled "Method and apparatus for an improved baffle plate in a plasma processing system", filed on Sep. 30, 2002; U.S. patent application Ser. No. 10/259,380, entitled "Method and apparatus for an improved baffle plate in a plasma processing system", filed on Sep. 30, 2002, now U.S. Pat. No. 7,166,166; U.S. Pat. No. 7,137,353, entitled "Method and apparatus for an improved deposition shield in a plasma processing system", filed on Sep. 30, 2002; U.S. Pat. No. 6,798,519, entitled "Method and apparatus for an improved optical window deposition shield in a plasma processing system", filed on Sep. 30, 2002; and U.S. patent application Ser. No. 10/259,306, entitled "Method and apparatus for an improved bellows shield in a plasma processing system", filed on Sep. 30, 2002, now U.S. Pat. No. 7,204,912. The entire contents of all of those applications are herein incorporated by reference in their entirety.

FIELD OF THE INVENTION

The present invention relates to an improved component for a plasma processing system and more particularly to an upper electrode employed in a plasma processing system to introduce a processing gas.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, components of the plasma processing system, known to sustain exposure to the processing plasma, are coated with a protective barrier. For example, components fabricated from aluminum can be anodized to produce a surface layer of aluminum oxide, which is more resistant to the plasma. In another example, a consumable or replaceable component, such as one fabricated from silicon, quartz, alumina, carbon, or silicon carbide, can be inserted within the processing chamber to protect the surfaces of more valuable components that would impose greater costs during frequent replacement. Furthermore, it is desirable to select surface materials that minimize the introduction of unwanted contaminants, impurities, etc. to the processing plasma and possibly to the devices formed on the substrate.

In both cases, the inevitable failure of the protective coating, either due to the integrity of the protective barrier or the integrity of the fabrication of the protective barrier, and the consumable nature of the replaceable components demands frequent maintenance of the plasma processing system. This frequent maintenance can produce costs associated with plasma processing down-time and new plasma processing chamber components, which can be excessive.

SUMMARY OF THE INVENTION

The present invention provides an improved upper electrode for a plasma processing system, wherein the design and fabrication of the upper electrode advantageously addresses the above-identified shortcomings.

It is an object of the present invention to provide an electrode plate configured to be coupled to an upper assembly of a plasma processing system comprising a first surface for coupling the electrode plate to the upper assembly, a second surface, opposite the first surface, comprising a plasma surface configured to face a processing plasma in the plasma processing system and a mating surface for mating with the plasma processing system, and a peripheral edge.

The electrode plate further comprises one or more gas injection orifices, wherein each gas injection orifice comprises an entrant region for receiving a processing gas and an exit region for coupling the processing gas to the plasma processing system, the exit region comprising an injection surface.

The electrode plate further includes a plurality of fastening receptors for receiving fastening devices in order to attach the electrode plate to the upper assembly.

The electrode plate further includes a plenum cavity coupled to the first surface, configured to receive the processing gas, and configured to distribute the processing gas to the one or more gas injection orifices.

The electrode plate further includes a first sealing feature coupled to the first surface of the electrode plate and configured to seal the electrode plate with the upper assembly.

The electrode plate can further comprise a diagnostics port, and a second sealing feature coupled to the first surface of the electrode plate and configured to seal the diagnostics port with the upper assembly. The diagnostics port can include an entrant cavity and an exit through-hole comprising an interior surface.

The electrode plate further comprises a protective barrier formed on a plurality of exposed surfaces of the electrode plate facing the processing plasma.

It is a further object of the present invention that the plurality of exposed surfaces of the electrode plate can comprise the plasma surface of the second surface of the electrode plate. Additionally, the exposed surfaces can further comprise the injection surface of the exit region in the one or more gas injection orifices, and the interior surface of the exit throughhole in the diagnostics port.

The present invention provides a method of producing the electrode plate in the plasma processing system comprising the steps: fabricating the electrode plate; anodizing the electrode plate to form a surface anodization layer on the electrode plate; machining the exposed surfaces on the electrode plate to remove the surface anodization layer; and forming a protective barrier on the exposed surfaces. The present invention may also optionally include machining the first surface of the electrode plate excluding the plenum cavity, the first sealing feature, and the second sealing feature.

The present invention provides another method of producing the electrode plate in the plasma processing system comprising the steps: fabricating the electrode plate; masking the exposed surfaces on the electrode plate to prevent formation of a surface anodization layer; anodizing the electrode plate to form the surface anodization layer on the electrode plate; unmasking the exposed surfaces; and forming a protective barrier on the exposed surfaces. The present invention may also optionally include masking other non-exposed surfaces (e.g., the first surface of the electrode plate excluding the plenum cavity, the first sealing feature, and the second sealing feature).

The present invention provides another method of producing the electrode plate for the upper electrode in the plasma processing system comprising the steps: fabricating the electrode plate; and forming a protective barrier on the exposed surfaces.

The present invention may also include a process of combining machining and masking to prepare the exposed surfaces to receive the protective barrier, and then forming the protective barrier on the exposed surfaces. For example, two of the exposed surfaces can be masked prior to anodizing, and two of the surfaces can be machined after anodizing to create four exposed surfaces on which the protective barrier can be formed.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

Figure 1:
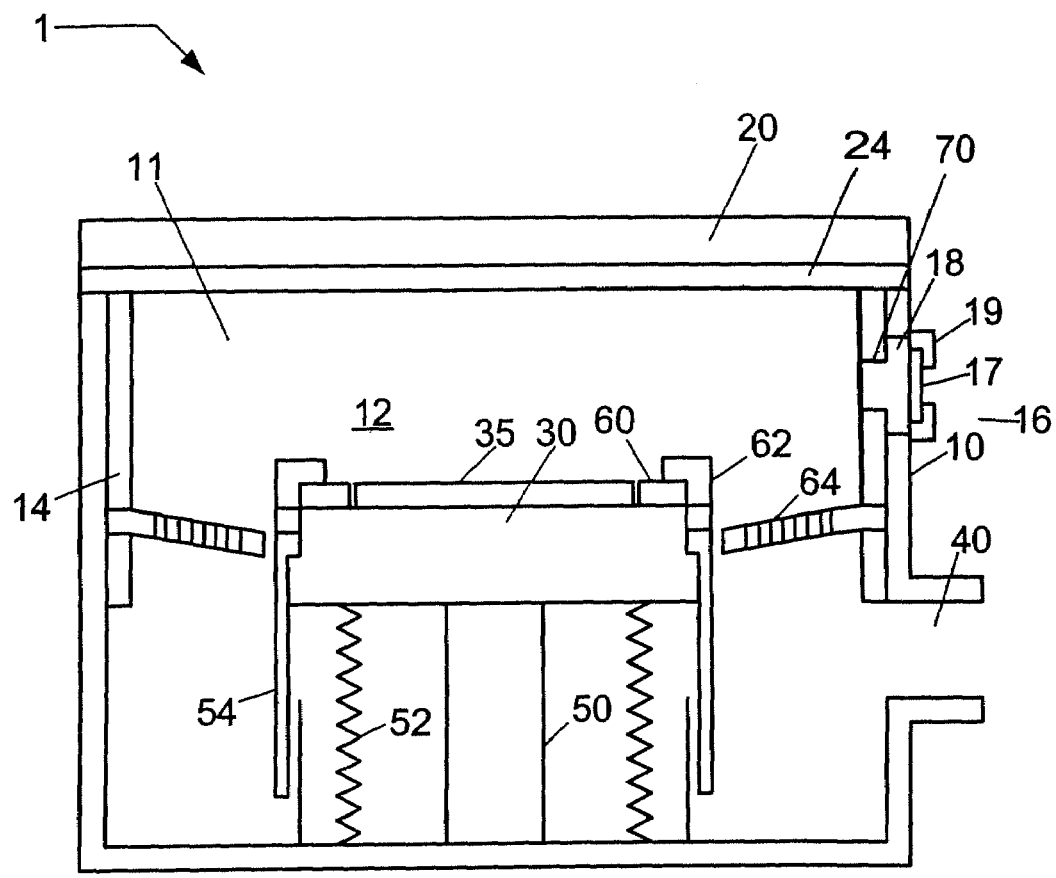
FIG. 1 shows a simplified block diagram of a plasma processing system comprising an upper electrode including an electrode plate according to an embodiment of the present invention.

According to an embodiment of the present invention, a plasma processing system 1 is depicted in FIG. 1 comprising a plasma processing chamber 10, an upper assembly 20, an electrode plate 24, a substrate holder 30 for supporting a substrate 35, and a pumping duct 40 coupled to a vacuum pump (not shown) for providing a reduced pressure atmosphere 11 in plasma processing chamber 10. Plasma processing chamber 10 can facilitate the formation of a processing plasma in a process space 12 adjacent substrate 35. The plasma processing system 1 can be configured to process various substrates (i.e. 200 mm substrates, 300 mm substrates, or larger).

In the illustrated embodiment, upper assembly 20 can comprise at least one of a cover, a gas injection assembly, and an upper electrode impedance match network. For example, the electrode plate 24 can be coupled to an RF source, and facilitate an upper electrode for the plasma processing system 1. In another alternate embodiment, the upper assembly 20 comprises a cover and an electrode plate 24, wherein the electrode plate 24 is maintained at an electrical potential equivalent to that of the plasma processing chamber 10. For example, the plasma processing chamber 10, the upper assembly 20, and the electrode plate 24 can be electrically connected to ground potential, and facilitate an upper electrode for the plasma processing system 1.

Plasma processing chamber 10 can, for example, further comprise a deposition shield 14 for protecting the plasma processing chamber 10 from the processing plasma in the process space 12, and an optical viewport 16. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the plasma processing chamber 10. Optical window deposition shield 18 can extend through an opening 70 within deposition shield 14. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can, for example, be coupled to the substrate holder 30 and configured to protect the bellows 52 from the processing plasma. Substrate holder 10 can, for example, further be coupled to at least one of a focus ring 60, and a shield ring 62. Furthermore, a baffle plate 64 can extend about a periphery of the substrate holder 30.

Substrate 35 can be, for example, transferred into and out of plasma processing chamber 10 through a slot valve (not shown) and chamber feed-through (not shown) via a robotic substrate transfer system, where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermoelectric heaters/coolers can be included.

In the illustrated embodiment, shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, any combination thereof, and with and without DC magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2:
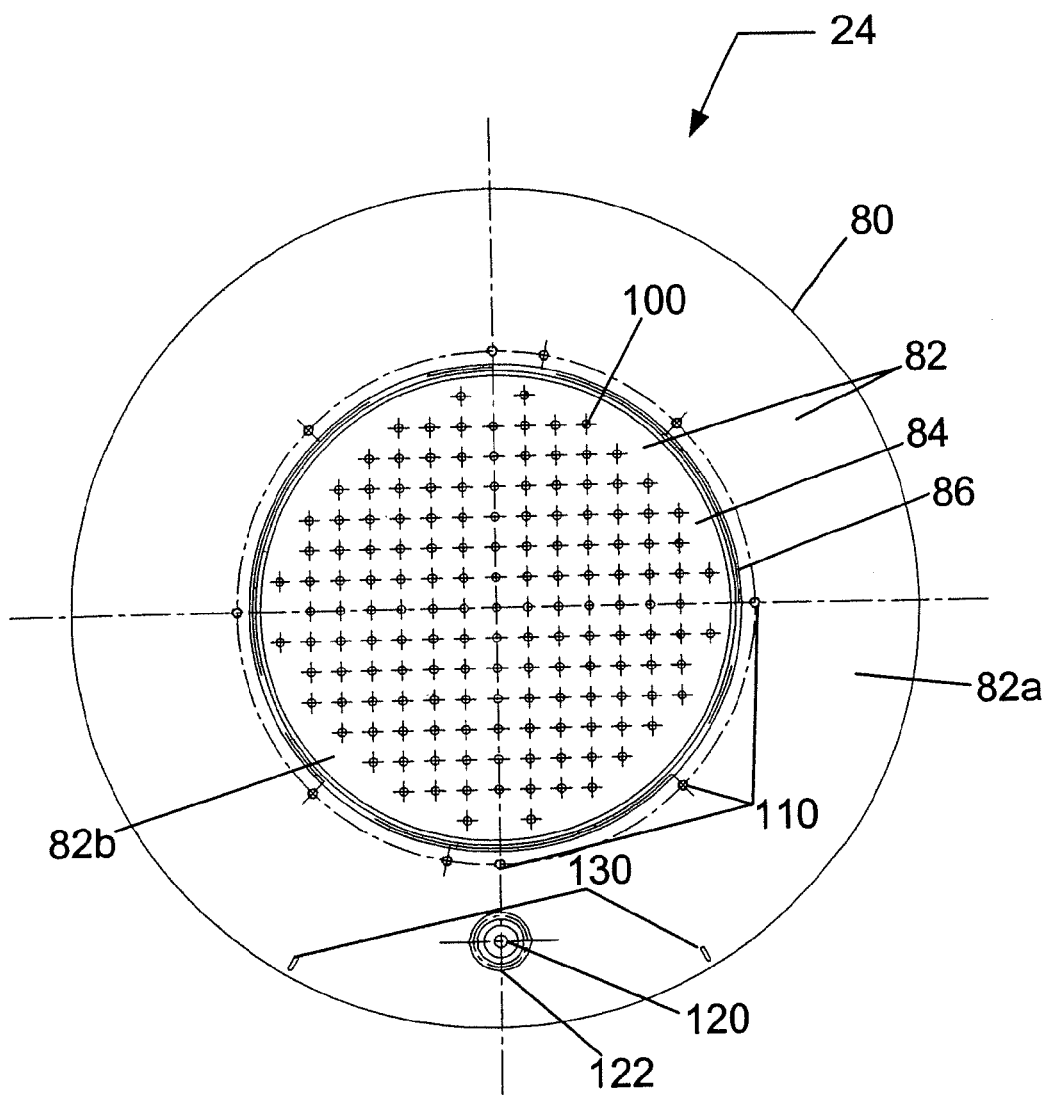
FIG. 2 shows a plan view of an electrode plate for a plasma processing system according to an embodiment of the present invention.
Figure 3:
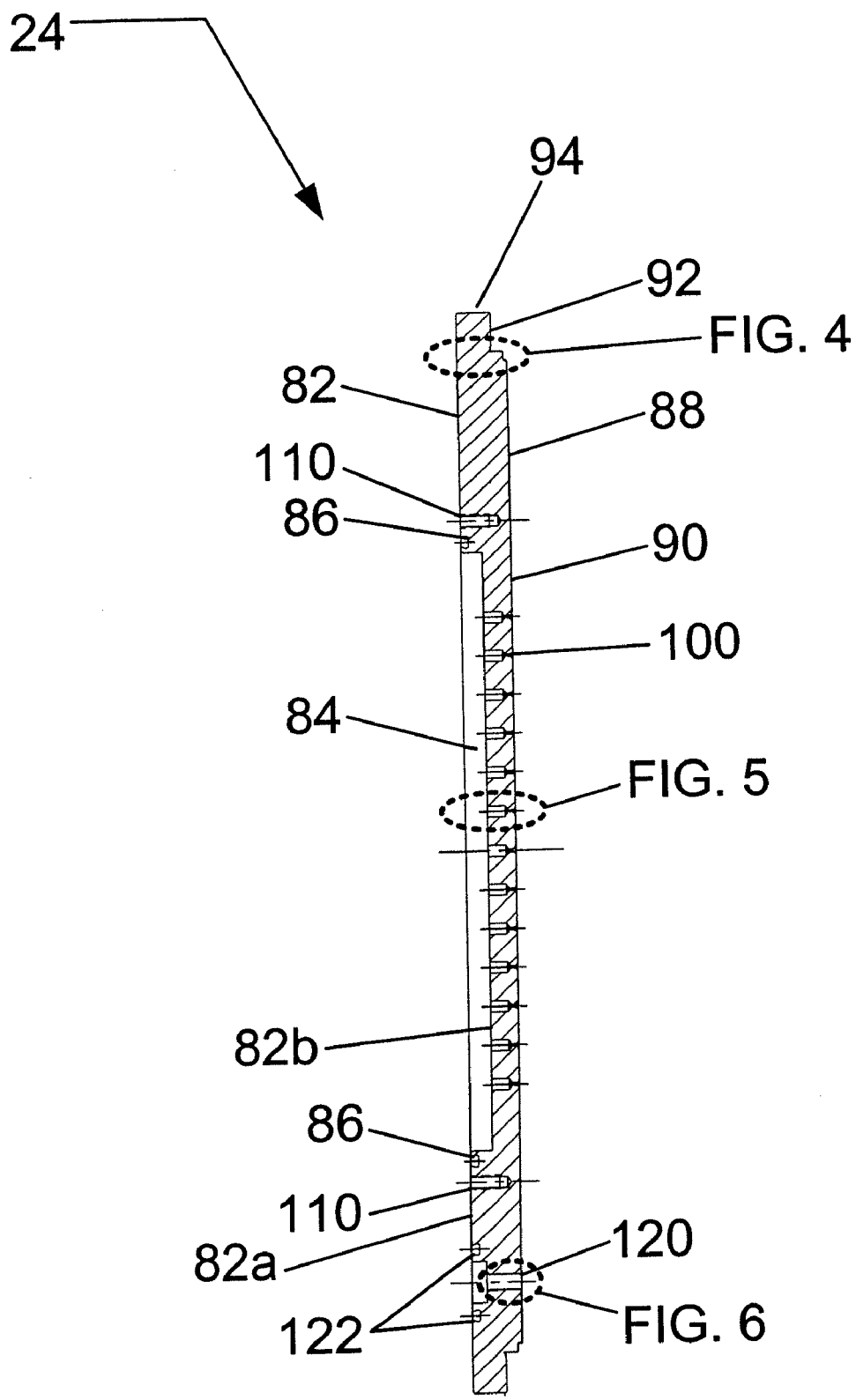
FIG. 3 shows a cross-sectional view of an electrode plate for the plasma processing system according to an embodiment of the present invention.

Referring now to an illustrated embodiment of the present invention depicted in FIG. 2 (plan view) and FIG. 3 (cross-sectional view), electrode plate 24 comprises a first surface 82 having a coupling surface 82a for coupling the electrode plate 24 to the upper assembly 20, a second surface 88 comprising a plasma surface 90 configured to face the processing plasma in the plasma processing chamber 10 and a mating surface 92 for mating the electrode plate 80 with the plasma processing chamber 10, and a peripheral edge 94.

Figure 4:
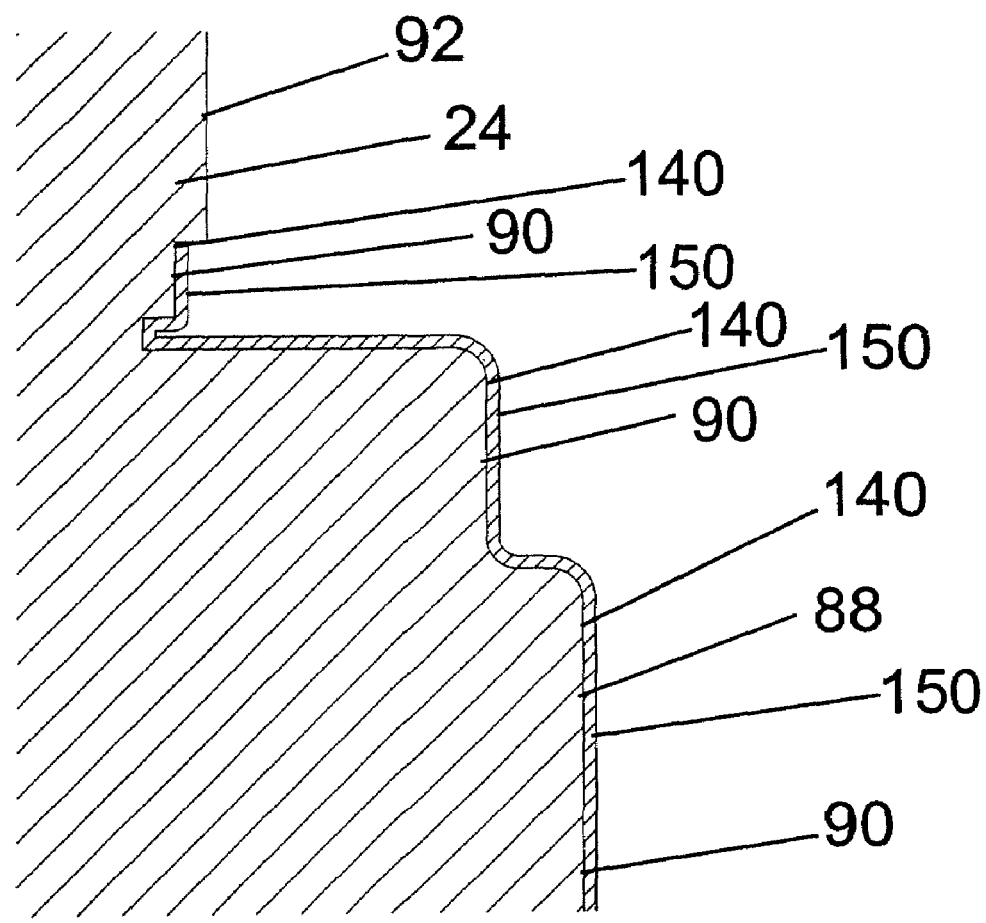
FIG. 4 shows an exploded view of a mating surface and a plasma surface of an electrode plate for the plasma processing system according to an embodiment of the present invention.

FIG. 4 provides an expanded view of the mating surface 92 and the plasma surface 90 in proximity to the peripheral edge 94 of electrode plate 24.

Figure 5:
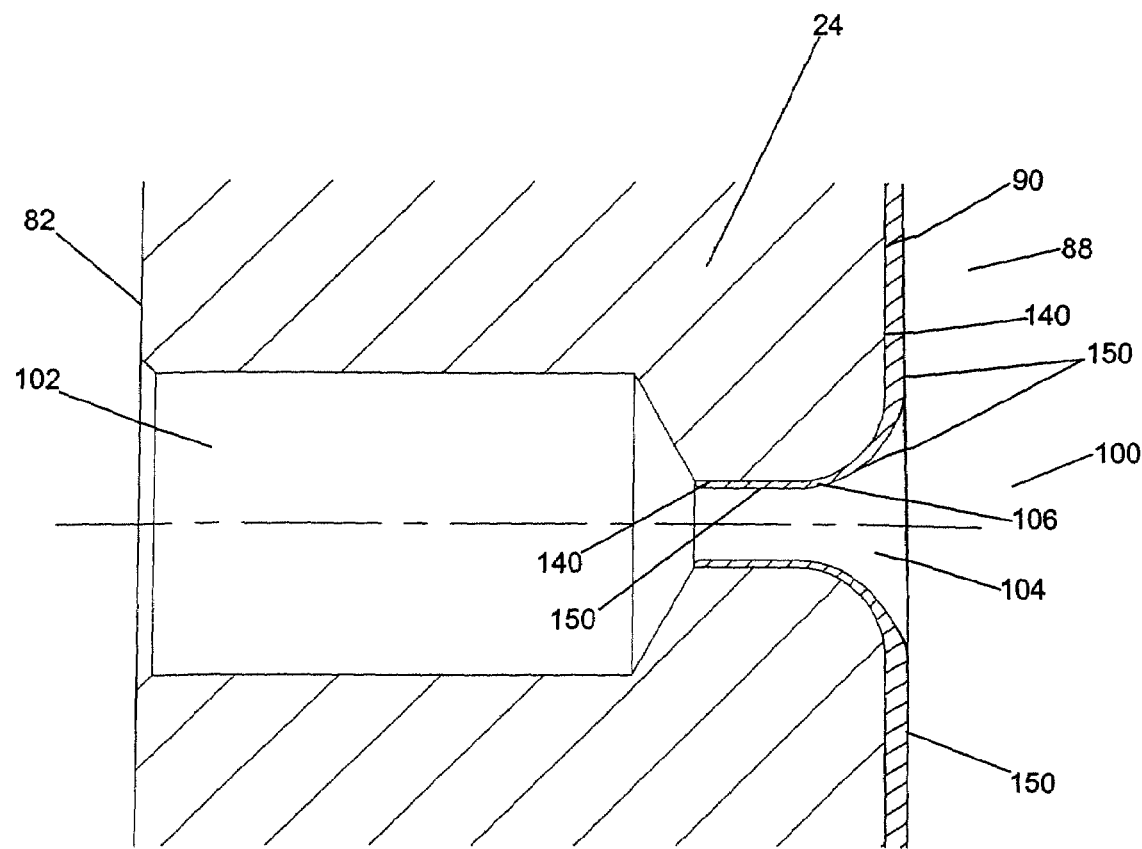
FIG. 5 shows an exploded view of a gas injection orifice in an electrode plate for the plasma processing system according to an embodiment of the present invention.

With continuing reference to FIG. 2 and FIG. 3, and as shown in FIG. 5, the electrode plate 24 further includes one or more gas injection orifices 100 coupled to the plenum surface 82b and the second surface 88, wherein each gas injection orifice 100 comprises an entrant region 102 for receiving a processing gas and an exit region 104 for coupling the processing gas to the plasma processing chamber 10, the exit region 104 comprising an injection surface 106 contiguous with the plasma surface 90. The processing gas can, for example, comprise a mixture of gases such as argon, $CF_4$ and $O_2$, or argon, $C_4F_8$ and $O_2$ for oxide etch applications, or other chemistries such as, for example, $O_2/CO/Ar/C_4F_8$, $O_2/Ar/C_4F_8$, $O_2/CO/AR/C_5F_8$, $O_2/CO/Ar/C_4F_6$, $O_2/Ar/C_4F_6$, $N_2/H_2$, $N_2/O_2$.

For example, the number of gas injection orifices 100 formed within electrode plate 24 can range from 1 to 10000. Desirably, the number of gas injection orifices 100 ranges from 50 to 500; and, preferably, the number of gas injection orifices 100 is at least 100. Furthermore, for example, a diameter of the gas injection orifice can range from 0.1 to 20 mm. Desirably, the diameter ranges from 0.5 to 5 mm, and preferably ranges from 0.5 to 2mm. In addition, for example, a length of a gas injection orifice can range from 1 to 20 mm. Desirably, the length ranges from 2 to 15 mm, and preferably ranges from 3 to 12 mm.

Additionally, as shown in FIG. 3, electrode plate 24 comprises a plenum cavity 84 having a plenum surface 82b that is part of the first surface 82, configured to receive the processing gas, and configured to distribute the processing gas to the plurality of gas injection orifices 100.

Additionally, electrode plate 24 can comprise a first sealing feature 86 coupled to the coupling surface 82a of the electrode plate 24 and configured to seal the electrode plate 24 with the upper assembly 20. The first sealing feature can, for example, comprise a dovetail cross-section or rectangular cross-section configured for receiving an O-ring. In an alternate embodiment, an electrical coupling feature (not shown) can be integrated with the coupling surface 82a of the electrode plate 24 in order to provide improved electrical coupling between the electrode plate 24 and the upper electrode 20. The electrical coupling feature can, for example, comprise Spirashield (commercially available from Spira Manufacturing Company), known to those skilled in the art of vacuum processing.

The electrode plate 24 can further include a plurality of fastening receptors 110 for receiving fastening devices (such as bolts) (not shown) in order to attach the electrode plate 24 to the upper assembly 20. For example, the number of fastening receptors 110 formed within electrode plate 24 can range from 1 to 100. Desirably, the number of fastening receptors 110 can range from 5 to 20; and, preferably, the number of fastening receptors 110 is at least 8.

Figure 6:
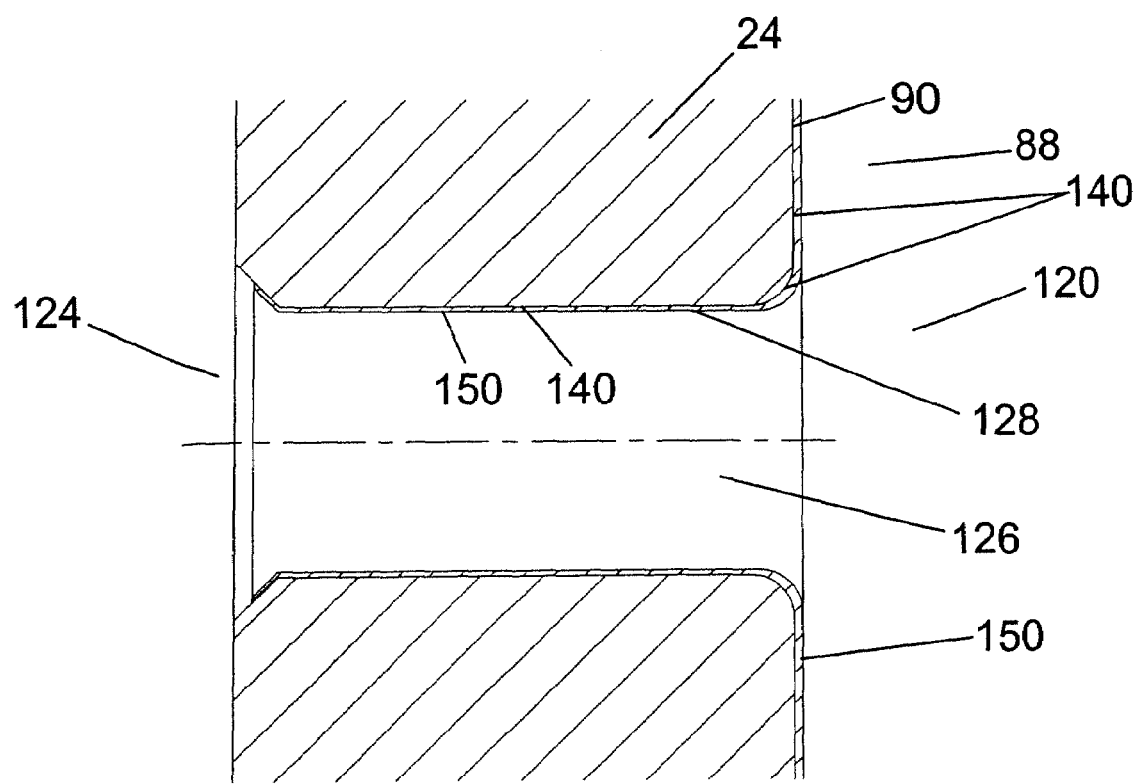
FIG. 6 shows an exploded view of an exit through-hole of a diagnostics port in an electrode plate for the plasma processing system according to an embodiment of the present invention.

The electrode plate 24 can further comprise a diagnostics port 120, and a second sealing feature 122 coupled to the coupling surface 82a of the electrode plate 24 and configured to seal the diagnostics port 120 with the upper assembly 20. As depicted in FIG. 6, the diagnostics port 120 can include an entrant cavity 124 and an exit through-hole 126 comprising an interior surface 128 contiguous with the plasma surface 90. Similarly, the second sealing feature can, for example, comprise a dovetail cross-section or rectangular cross-section configured for receiving an O-ring. The diagnostics port 120 can be used to couple a diagnostics system (not shown) with the reduced pressure atmosphere 11 of plasma processing chamber 10. For example, the diagnostics system can comprise a pressure manometer.

Additionally, electrode plate 24 can, for example, comprise one or more alignment features 130 in order to provide for proper coupling of the electrode plate 24 to the upper assembly 20. The one or more alignment features 130 can, for example, comprise two slots as shown in FIG. 2.

As illustrated in FIG. 5 and FIG. 6, a plurality of exposed surfaces 140 can comprise the plasma surface 90 of the second surface 88 of the electrode plate 24, the injection surface 106 of the one or more gas injection orifices 100, and the interior surface 128 of the diagnostics port 120. Alternately, the exposed surfaces comprise all surfaces on the electrode plate 24.

Referring now to FIGS. 2 through 6, the electrode plate 24 further comprises a protective barrier 150 formed on the exposed surfaces 140 of the electrode plate 24. In an embodiment of the present invention, the protective barrier 150 can comprise a compound including an oxide of aluminum such as $Al_2O_3$. In another embodiment of the present invention, the protective barrier 150 comprises a mixture of $Al_2O_3$ and $Y_2O_3$. In another embodiment of the present invention, the protective barrier 150 comprises at least one of a III-column element (column III of periodic table) and a Lanthanon element. In another embodiment of the present invention, the III-column element comprises at least one of Yttrium, Scandium, and Lanthanum. In another embodiment of the present invention, the Lanthanon element comprises at least one of Cerium, Dysprosium, and Europium. In another embodiment of the present invention, the compound forming protective barrier 150 comprises at least one of Yttria ($Y_2O_3$), $Sc_2O_3$, $Sc_2F_3$, $YF_3$, $La_2O_3$, $CeO_2$, $Eu_2O_3$, and $Dy_2O_3$.

In an embodiment of the present invention, the protective barrier 150 formed on electrode plate 24 comprises a minimum thickness, wherein the minimum thickness can be specified as constant across at least one of the exposed surfaces 140. In another embodiment, the minimum thickness can be variable across the exposed surfaces 140. Alternately, the minimum thickness can be constant over a first portion of an exposed surface and variable over a second portion of the exposed surface. For example, a variable thickness can occur on a curved surface, on a corner, or in a hole. For example, the minimum thickness can ranges from 0.5 micron to 500micron. Desirably; the minimum thickness can range from 100 micron to 200micron; and, preferably, the minimum thickness is at least 120 micron.

Figure 7:
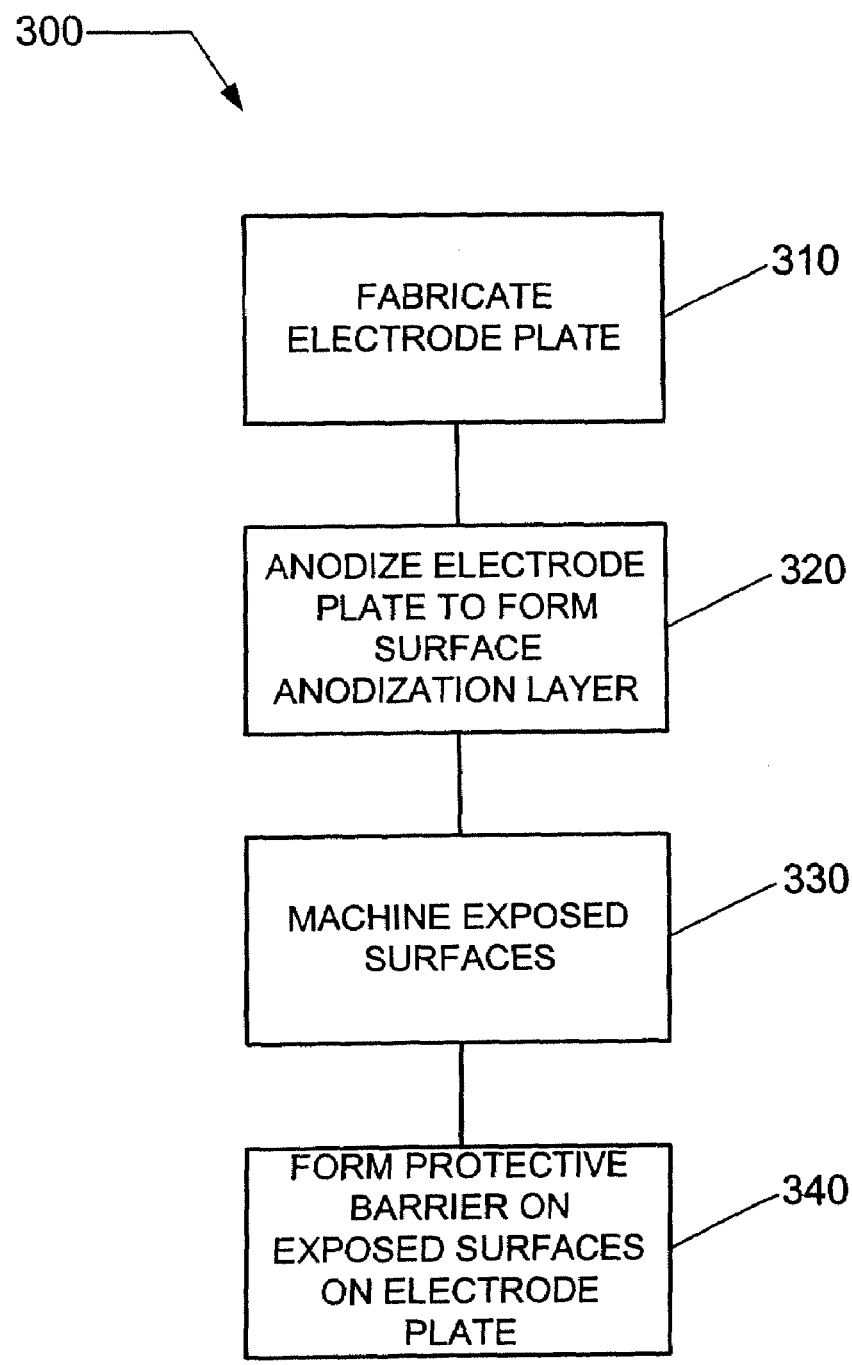
FIG. 7 presents a method of producing an electrode plate for the plasma processing system according to an embodiment of the present invention.

FIG. 7 presents a method of producing the electrode plate in the plasma processing system described in FIG. 1 according to an embodiment of the present invention. A flow diagram 300 begins in 310 with fabricating the electrode plate (e.g., an electrode plate having the characteristics of the plate described with reference to FIGS. 2-6). Fabricating the electrode plate can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The electrode plate can, for example, be fabricated from aluminum.

In 320, the electrode plate is anodized to form a surface anodization layer. For example, when fabricating the electrode plate from aluminum, the surface anodization layer comprises aluminum oxide ($Al_2O_3$). Methods of anodizing aluminum components are well known to those skilled in the art of surface anodization.

In 330, the surface anodization layer is removed from the exposed surfaces using standard machining techniques. During the same machining step, or during a separate machining step, other surfaces (e.g., the first surface of the electrode plate excluding the plenum cavity, the first sealing feature, and the second sealing feature) may also be machined (e.g., to produce a flat or bare surface that provides at least one of a good mechanical or electrical contact at the machined surface).

In 340, a protective barrier 150 (as described above) is formed on the exposed surfaces 140. A protective barrier comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

Figure 8:
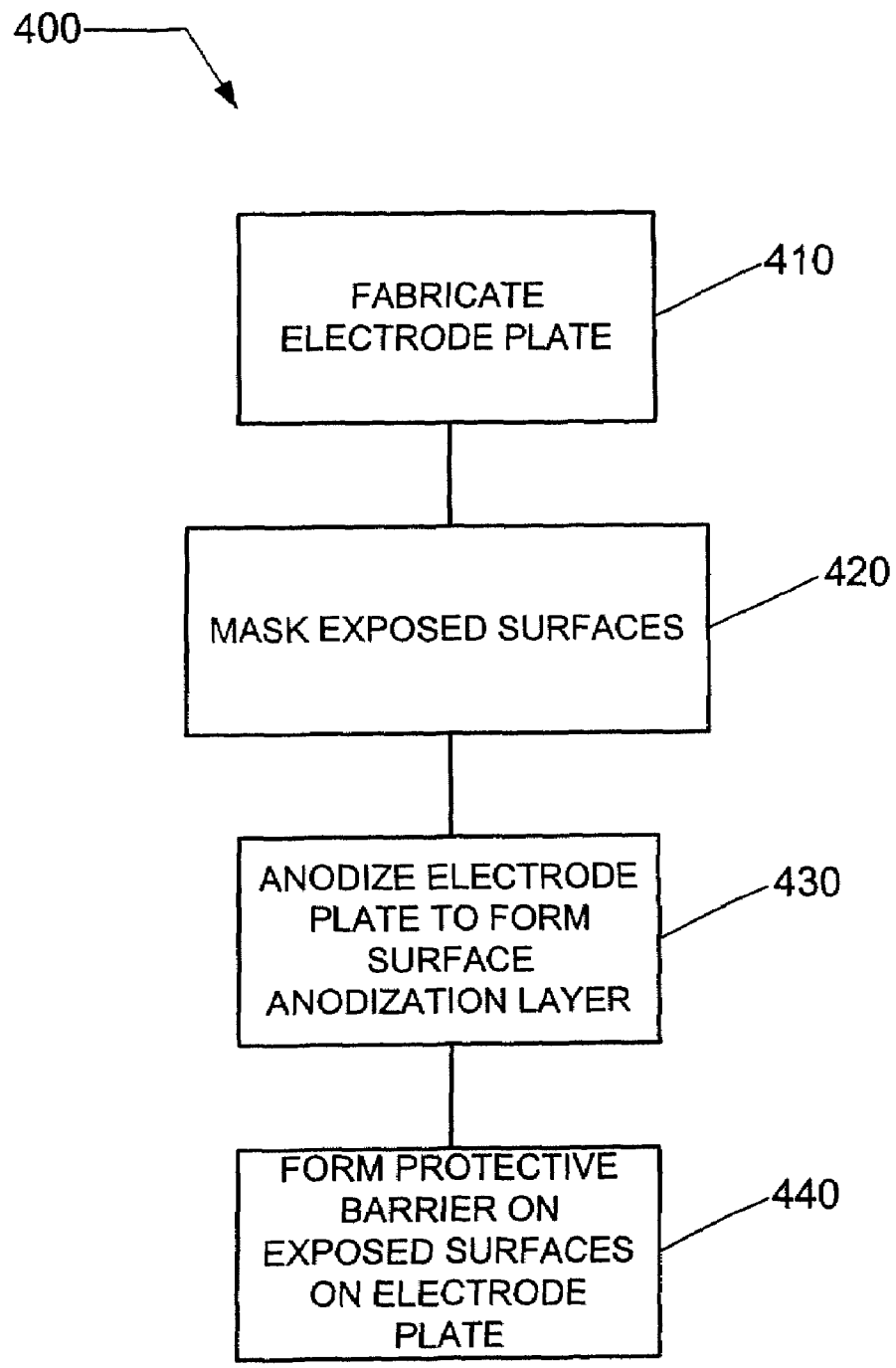
FIG. 8 presents a method of producing an electrode plate for the plasma processing system according to another embodiment of the present invention.

FIG. 8 presents a method of fabricating the electrode plate in the plasma processing system described in FIG. 1 according to another embodiment of the present invention. A flow diagram 400 begins in 410 with machining the electrode plate (e.g., an electrode plate having the characteristics of the plate described with reference to FIGS. 2-6). Fabricating the electrode plate can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The electrode plate can, for example, be fabricated from aluminum.

In 420, exposed surfaces 140 are masked to prevent the formation of a surface anodization layer thereon. Techniques for surface masking and unmasking are well known to those skilled in the art of surface coatings and surface anodization. During the same masking step, or during a separate masking step, other surfaces (e.g., the first surface of the electrode plate excluding the plenum cavity, the first sealing feature, and the second sealing feature) may also be masked (e.g., to maintain a flat or bare surface that provides at least one of a good mechanical or electrical contact at the machined surface).

In 430, the electrode plate is anodized to form a surface anodization layer on the remaining unmasked surfaces. For example, when fabricating the electrode plate with the deposition shield from aluminum, the surface anodization layer comprise aluminum oxide ($Al_2O_3$). Methods of anodizing aluminum components are well known to those skilled in the art of surface anodization.

In 440, the exposed surfaces 140 are unmasked, and a protective barrier 150 is formed on the exposed surfaces 140. A protective barrier comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

Figure 9:
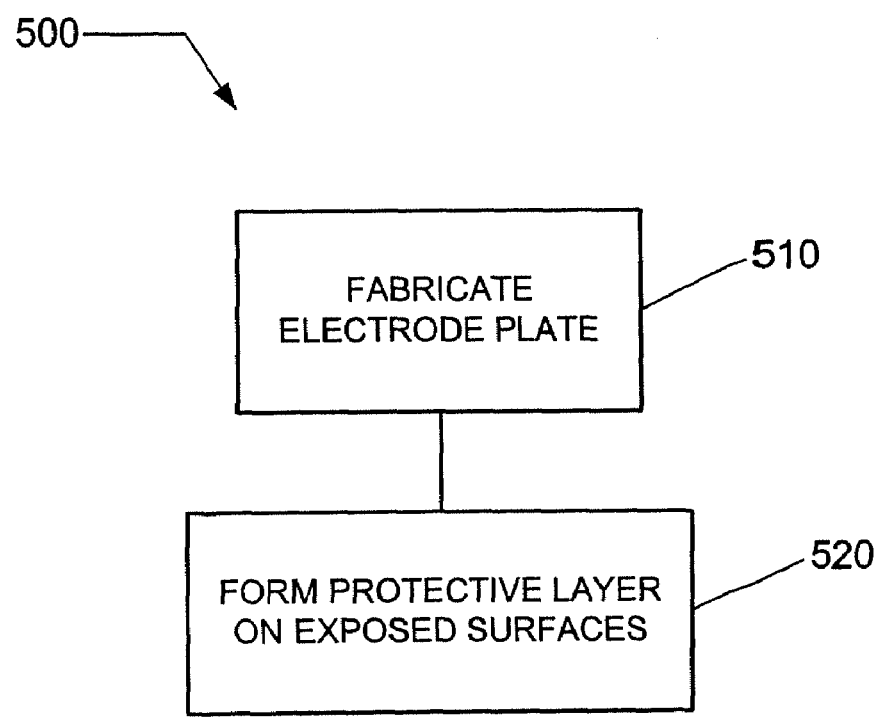
FIG. 9 presents a method of producing an electrode plate for the plasma processing system according to another embodiment of the present invention.

FIG. 9 presents a method of producing the electrode plate in the plasma processing system described in FIG. 1 according to another embodiment of the present invention. A flow diagram 500 begins in 510 with fabricating the electrode plate (e.g., an electrode plate having the characteristics of the plate described with reference to FIGS. 2-6). Fabricating the electrode plate can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The electrode plate can, for example, be fabricated from aluminum.

In 520, a protective barrier 150 (as described above) is formed on the exposed surfaces 145 of the electrode plate. A protective barrier comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

In an alternate embodiment of the present invention, a mixture of masking and machining prepares the proper number of surfaces to be protected with a protective barrier 150. For example, the plasma surface of the second surface of the electrode plate may be masked to prevent an anodization layer from being formed thereon, while the injection surface of the exit region in the plurality of gas injection orifices is machined after anodization to present a bare, exposed surface.

While not necessary in order to form the protective barrier 150 on the exposed surfaces 140, it is also possible to machine other non-exposed surfaces on which an anodization layer has been formed or to mask other non-exposed surfaces prior to performing anodization (e.g., in order to provide a bare surface for an electrical or mechanical connection between parts). Such surfaces may include surfaces of sealing or mating features.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. An upper electrode for a plasma processing system comprising:
    an electrode plate comprising a first surface for coupling said electrode plate to an upper assembly, a second surface comprising a plasma surface configured to face a processing space in said plasma processing system and a mating surface positioned radially outward of the plasma surface and for mating said electrode plate with said plasma processing system, a peripheral edge, and one or more gas injection orifices coupled to said first surface and said second surface and configured to couple a processing gas to said processing space, wherein the plasma surface is axially recessed from the mating surface at least at an area adjacent to the mating surface;
    a protective barrier coupled to a plurality of exposed surfaces of said electrode plate, said exposed surfaces comprising said plasma surface and said protective barrier being a coating which comprises yttrium or dysprosium, or a combination thereof, wherein the protective barrier terminating on the plasma surface that is axially recessed from the mating surface; and
    a diagnostics port comprising an entrant cavity, and an exit through-hole, wherein said exit through-hole comprises an interior surface, wherein said exposed surfaces further comprise said interior surface of said diagnostics port.

2. The upper electrode of claim 1, wherein:
    said mating surface comprises a first substantially planar surface extending radially inward from said peripheral edge; and
    said plasma surface comprises a second substantially planar surface radially and axially spaced from said first substantially planar surface, said second substantially planar surface having said one or more gas injection orifices formed therein.

3. The upper electrode of claim 2, wherein said protective barrier is provided on said second substantially planar surface and extends from a center of the upper electrode radially outward, wherein said plasma surface that is axially recessed from the mating surface is
    at a location radially between an outer periphery of said first substantially planar surface and an outer periphery of said second substantially planar surface.

4. The upper electrode of claim 3, wherein said protective barrier is provided only on bare surfaces of the electrode plate not having an anodization layer thereon.

5. The upper electrode of claim 2, wherein said plasma surface that is axially recessed from the mating surface comprises a recess recessed from said first substantially planar surface and radially positioned between said first substantially planar surface and said second substantially planar surface.

6. The upper electrode of claim 5, wherein said protective barrier is provided on at least a portion of said recess.

7. The upper electrode of claim 5, wherein said protective barrier is provided on only a portion of said recess.

8. The upper electrode of claim 5, wherein:
    said plasma surface that is axially recessed from the mating surface is a third substantially planar surface radially positioned between said first substantially planar surface and said second substantially planar surface, said third substantially planar surface also being axially positioned between said first substantially planar surface of the mating surface and said second substantially planar surface of the plasma surface; and
    wherein said recess comprises:
        a first recess surface recessed from said first substantially planar surface, and
        a second recess surface recessed from said first recess surface and radially positioned between said first recess surface and said second substantially planar surface.

9. The upper electrode of claim 8, wherein said protective baffler is provided on said second substantially planar surface, said third substantially planar surface, said second recess surface, and a portion of said first recess surface, said protective barrier terminating at a location between said first recess surface and said first substantially planar surface of the mating surface.

10. The upper electrode of claim 9, wherein:
    said second substantially planar surface is coupled to said third substantially planar surface by a first sidewall which is substantially at a right angle to said second and third substantially planar surfaces, and said third substantially planar surface is coupled to said second recess surface by a second sidewall which is substantially at a right angle to said third substantially planar surface and said second recess surface.

11. The upper electrode of claim 10, wherein at least one of a first transition from the second substantially planar surface to the first sidewall, a second transition from the first sidewall to the third substantially planar surface, and a third transition from the third substantially planar surface to said second sidewall is rounded.

12. The upper electrode of claim 11, wherein said protective barrier comprises a spray coating.

13. The upper electrode of claim 11, wherein said protective barrier is provided in direct contact with a bare surface of said electrode plate, said bare surface not having an anodization layer thereon.

14. The upper electrode of claim 11, wherein each of said plasma surface and said interior surface of the diagnostics port is a bare surface not having an anodization layer thereon, and said protective barrier is provided in direct contact with said bare surface.

15. The upper electrode of claim 14, wherein said protective baffler is provided on only a portion of said diagnostics port.

16. The upper electrode of claim 11, further comprising:
a plenum cavity formed in and substantially centered on said first surface of the electrode plate; and
a plurality of fastening receptors formed in said first surface and circumferentially spaced around said plenum cavity, wherein said diagnostic port is radially positioned between the fastening receptors and the peripheral edge of said electrode plate.

17. The upper electrode of claim 16, wherein said diagnostics port comprises:
a diagnostic port recess in said first surface, and
said entrant cavity opening to said diagnostic port recess and said exit through-hole opening to said second surface.

18. The upper electrode of claim 17, wherein said protective barrier is provided on at least a portion of said diagnostics port.

19. The upper electrode of claim 18, wherein said portion of said diagnostics port is a bare surface not having an anodization layer thereon.

20. The upper electrode of claim 17, wherein:
said entrant cavity comprises a tapered opening,
said protective barrier is provided on only a portion of said tapered opening adjacent to said exit through hole, and
said protective barrier is not provided on a remaining portion of said tapered opening adjacent to said diagnostic port recess, and is not provided on said diagnostic port recess.

21. The upper electrode of claim 16, further comprising a sealing feature configured to seal said diagnostics port when said electrode plate is coupled to said upper assembly.

22. The upper electrode of claim 21, wherein said sealing feature comprises a bare metal not having said protective barrier or an anodization layer provided thereon.

23. The upper electrode of claim 1, wherein:
a first portion of said upper electrode has an anodization layer provided thereon; and
a second portion of said upper electrode does not have said anodization layer thereon and does not include said protective barrier thereon.

24. The upper electrode of claim 23, wherein said second portion comprises at least part of said first surface.

25. The upper electrode of claim 23, wherein said second portion comprises said mating surface.

26. The upper electrode of claim 1, wherein at least part of said first surface does not have said coating thereon.

27. The upper electrode of claim 26, wherein said coating is a spray coating.

28. The upper electrode of claim 1, wherein said coating is not provided on said first surface.

29. The upper electrode of claim 1, wherein said first surface comprises:
a plenum cavity formed substantially in a center of said first surface; and
a coupling surface extending radially outward from an edge of said plenum cavity, wherein:
a surface of said plenum cavity has an anodization layer provided thereon, and
said coupling surface does not have said anodization layer provided thereon and does not have said protective barrier provided thereon.

30. The upper electrode of claim 29, wherein said plenum cavity comprises a plenum surface having said one or more gas injection orifices formed therein such that said plenum cavity receives said processing gas and distributes said processing gas to said one or more gas injection orifices.

31. The upper electrode of claim 30, wherein said one or more gas injection orifices comprises a plurality of gas injection orifices each comprising:
an entrant region that opens to said plenum surface;
an exit region that opens to said second surface, wherein:
said entrant region has a larger diameter than said exit region,
said gas injection orifice further comprising a tapered transition that couples said entrant region to said exit region, and
said protective barrier is provided on at least a portion of said gas injection orifice.

32. The upper electrode of claim 31, wherein said portion of said gas injection orifice is a bare surface not having an anodization layer thereon.

33. The upper electrode of claim 32, wherein at least part of said first surface does not include said protective barrier.

34. The upper electrode of claim 31, wherein said protective barrier is provided on only a portion of said gas injection orifice.

35. The upper electrode of claim 1, wherein said protective barrier is a coating which comprises yttrium.

36. The upper electrode of claim 1, wherein said protective barrier is a coating which comprises $YF_3$.

37. The upper electrode of claim 1, wherein said protective barrier is a coating which comprises dysprosium.

38. The upper electrode of claim 1, wherein said protective barrier is a coating which comprises $Dy_2O_3$.

39. The upper electrode of claim 1, wherein said protective barrier is a coating which comprises an oxide of dysprosium.

40. An upper electrode for a plasma processing system comprising:
an electrode plate comprising a first surface for coupling said electrode plate to an upper assembly, a second surface comprising a plasma surface configured to face a processing space in said plasma processing system and a mating surface positioned radially outward of the plasma surface and for mating said electrode plate with said plasma processing system, a peripheral edge, and one or more gas injection orifices coupled to said first surface and said second surface and configured to couple a processing gas to said processing space, wherein the plasma surface is axially recessed from the mating surface at least at an area adjacent to the mating surface; and
a protective barrier provided on a plurality of exposed surfaces of said electrode plate, said exposed surfaces comprising said plasma surface, wherein said protective barrier is a coating which comprises yttrium or dysprosium, or a combination thereof, wherein the protective barrier terminating on the plasma surface that is axially recessed from the mating surface, wherein said first surface comprises:
a plenum recess formed substantially in a center of the first surface to form a plenum cavity that receives said processing gas and distributes said processing gas to said one or more gas injection orifices formed within the plenum recess in the first surface;
a coupling surface extending radially outward from an edge of said plenum recess;
a sealing feature formed in the coupling surface and surrounding said plenum recess; and a plurality of fastening receptors radially positioned between said sealing feature and said peripheral edge.

41. The upper electrode of claim 40, wherein:
said plenum recess has an anodization layer formed thereon; and
said coupling surface does not have said anodization layer formed thereon and does not have said protective barrier provided thereon.

42. The upper electrode of claim 41, wherein said sealing feature does not have said anodization layer formed thereon and does not have said protective barrier provided thereon.

43. The upper electrode of claim 41, wherein said plurality of fastening receptors are circumferentially spaced around said sealing feature, wherein said anodization layer is provided on at least a portion of an interior of each of said fastening receptors.

44. The upper electrode of claim 41, wherein said plurality of fastening receptors are circumferentially spaced around said sealing feature, said upper electrode further comprising a diagnostic port extending from said first surface to said second surface, said diagnostic port being positioned radially outward of said circumferentially spaced fastening receptors.

45. The upper electrode of claim 44, further comprising alignment features opening to said first surface and being positioned on symmetrically opposing sides of said diagnostic port.

46. The upper electrode of claim 45, further comprising another sealing feature surrounding said diagnostic port, wherein said another sealing feature does not have said anodization layer provided thereon and does not have said protective barrier provided thereon.

47. The upper electrode of claim 40, wherein said protective barrier is a coating which comprises yttrium.

48. The upper electrode of claim 40, wherein said protective barrier is a coating which comprises $YF_3$.

49. The upper electrode of claim 40, wherein said protective barrier is a coating which comprises dysprosium.

50. The upper electrode of claim 40, wherein said protective barrier is a coating which comprises $Dy_2O_3$.

51. The upper electrode of claim 40, wherein said protective barrier is a coating which comprises an oxide of dysprosium.

52. An upper electrode for a plasma processing system comprising:
an electrode plate comprising a first surface for coupling said electrode plate to an upper assembly, a second surface comprising a plasma surface configured to face a processing space in said plasma processing system and a mating surface positioned radially outward of the plasma surface and for mating said electrode plate with said plasma processing system, a peripheral edge, and one or more gas injection orifices coupled to said first surface and said second surface and configured to couple a processing gas to said processing space, wherein the plasma surface is axially recessed from the mating surface at least at an area adjacent to the mating surface; and
a protective barrier provided on a plurality of exposed surfaces of said electrode plate, said exposed surfaces comprising said plasma surface, wherein said protective barrier is a coating which comprises yttrium or dysprosium, or a combination thereof, wherein the protective barrier terminating on the plasma surface that is axially recessed from the mating surface, wherein:
said mating surface comprises a first substantially planar surface extending radially inward from said peripheral edge; and
said plasma surface comprises a second substantially planar surface radially and axially spaced from said first substantially planar surface, said second substantially planar surface having said one or more gas injection orifices formed therein.

53. The upper electrode of claim 52, wherein said protective barrier is provided on said second substantially planar surface and extends from a center of the upper electrode radially outward, wherein said plasma surface that is axially recessed from the mating surface is at a location radially between an outer periphery of said first substantially planar surface and an outer periphery of said second substantially planar surface.

54. The upper electrode of claim 53, wherein said protective barrier is provided only on bare surfaces of the electrode plate not having an anodization layer thereon.

55. The upper electrode of claim 52, wherein said plasma surface that is axially recessed from the mating surface is comprises a recess recessed from said first substantially planar surface and radially positioned between said first substantially planar surface and said second substantially planar surface.

56. The upper electrode of claim 55, wherein said protective barrier is provided on at least a portion of said recess.

57. The upper electrode of claim 55, wherein said protective barrier is provided on only a portion of said recess.

58. The upper electrode of claim 55, wherein:
said plasma surface that is axially recessed from the mating surface is a third substantially planar surface radially positioned between said first substantially planar surface and said second substantially planar surface, said third substantially planar surface also being axially positioned between said first substantially planar surface of the mating surface and said second substantially planar surface of the plasma surface; and
said recess comprises:
a first recess surface recessed from said first substantially planar surface, and
a second recess surface recessed from said first recess surface and radially positioned between said first recess surface and said second substantially planar surface.

59. The upper electrode of claim 58, wherein said protective barrier is provided on said second substantially planar surface of said plasma surface, said third substantially planar surface of said plasma surface, said second recess surface of said plasma surface, and a portion of said first recess surface of said plasma surface, said protective barrier terminating at a location between said first recess surface and said first substantially planar surface of said mating surface.

60. The upper electrode of claim 52, wherein said protective barrier is a coating which comprises yttrium.

61. The upper electrode of claim 52, wherein said protective barrier is a coating which comprises $YF_3$.

62. The upper electrode of claim 52, wherein said protective barrier is a coating which comprises dysprosium.

63. The upper electrode of claim 52, wherein said protective barrier is a coating which comprises $Dy_2O_3$.

64. The upper electrode of claim 52, wherein said protective barrier is a coating which comprises an oxide of dysprosium.

65. An upper electrode for a plasma processing system comprising:
an electrode plate comprising a first surface for coupling said electrode plate to an upper assembly, a second surface comprising a plasma surface configured to face a processing space in said plasma processing system and a mating surface positioned radially outward of the plasma surface and for mating said electrode plate with said plasma processing system, a peripheral edge, and one or more gas injection orifices coupled to said first surface and said second surface and configured to couple a processing gas to said processing space, wherein the plasma surface is axially recessed from the mating surface at least at an area adjacent to the mating surface; and a protective barrier provided on a plurality of exposed surfaces of said electrode plate, said exposed surfaces comprising said plasma surface, wherein said protective barrier is a coating which comprises yttrium or dysprosium, or a combination thereof, wherein the protective barrier terminating on the plasma surface that is axially recessed from the mating surface, wherein said first surface comprises:

a plenum cavity formed substantially in a center of said first surface; and a coupling surface extending radially outward from an edge of said plenum cavity, wherein:

a surface of said plenum cavity has an anodization layer provided thereon, and said coupling surface does not have said anodization layer provided thereon and does not have said protective barrier provided thereon.

66. The upper electrode of claim 65, wherein said plenum cavity comprises a plenum surface having said one or more gas injection orifices formed therein such that said plenum cavity receives said processing gas and distributes said processing gas to said one or more gas injection orifices.

67. The upper electrode of claim 66, wherein said one or more gas injection orifices comprises a plurality of gas injection orifices each comprising:

an entrant region that opens to said plenum surface;

an exit region that opens to said second surface, wherein:

said entrant region has a larger diameter than said exit region, said gas injection orifice further comprising a tapered transition that couples said entrant region to said exit region, and said protective barrier is provided on at least a portion of said gas injection orifice.

68. The upper electrode of claim 67, wherein said portion of said gas injection orifice is a bare surface not having an anodization layer thereon.

69. The upper electrode of claim 67, wherein said protective barrier is provided on only a portion of said gas injection orifice.

70. The upper electrode of claim 69, wherein at least part of said first surface does not include said protective barrier.

71. The upper electrode of claim 65, wherein said protective barrier is a coating which comprises yttrium.

72. The upper electrode of claim 65, wherein said protective barrier is a coating which comprises $YF_3$.

73. The upper electrode of claim 65, wherein said protective barrier is a coating which comprises dysprosium.

74. The upper electrode of claim 65, wherein said protective barrier is a coating which comprises $Dy_2O_3$.

75. The upper electrode of claim 65, wherein said protective barrier is a coating which comprises an oxide of dysprosium.

* * * * *